United States Patent
Tseng

(10) Patent No.: US 7,949,911 B2
(45) Date of Patent: May 24, 2011

(54) METHOD FOR TESTING STORAGE APPARATUS AND SYSTEM THEREOF

(75) Inventor: Wen-Wu Tseng, Hsinchu County (TW)

(73) Assignee: Silicon Motion Inc., Jhubei, Hsinchu County (TW)

( * ) Notice: Subject to any disclaimer, the term of this patent is extended or adjusted under 35 U.S.C. 154(b) by 191 days.

(21) Appl. No.: 12/389,375

(22) Filed: Feb. 20, 2009

(65) Prior Publication Data
US 2010/0122129 A1    May 13, 2010

(30) Foreign Application Priority Data

Nov. 7, 2008 (TW) ................... 97143090 A

(51) Int. Cl.
*G06F 11/00* (2006.01)
*G11C 29/00* (2006.01)

(52) U.S. Cl. ........ 714/720; 714/718; 714/719; 714/703; 714/704; 714/42; 714/705; 365/201

(58) Field of Classification Search ................. None
See application file for complete search history.

(56) References Cited

U.S. PATENT DOCUMENTS

| | | | | |
|---|---|---|---|---|
| 5,802,078 | A | * | 9/1998 | Urabe et al. ................ 714/759 |
| 7,032,127 | B1 | * | 4/2006 | Egan et al. ...................... 714/8 |
| 2001/0031136 | A1 | * | 10/2001 | Kawamura et al. ............ 386/98 |
| 2005/0066237 | A1 | * | 3/2005 | Greenwald et al. ............ 714/42 |
| 2007/0162826 | A1 | * | 7/2007 | Major et al. ................ 714/763 |
| 2009/0327822 | A1 | * | 12/2009 | Kameda et al. .............. 714/718 |

OTHER PUBLICATIONS

Sexton, F.W.; Hash, G.L.; Connors, M.P.; Murray, J.R.; Schwank, J.R.; Winokur, P.S.; Bradley, E.G.; SEU and SEL response of the Westinghouse 64K E2PROM, Analog Devices AD7876 12-bit ADC, and the Intel 82527 serial communications controller, Jul. 20, 1994, Radiation Effects Data Workshop, 1994 IEEE, on p. 55-63.*

* cited by examiner

*Primary Examiner* — Jeffrey A Gaffin
*Assistant Examiner* — Guerrier Merant
(74) *Attorney, Agent, or Firm* — Winston Hsu; Scott Margo

(57) ABSTRACT

A method for testing a storage apparatus, which includes: (a) writing a specific pattern to a storage unit of a storage apparatus; (b) reading the specific pattern written to the storage apparatus; (c) determining an error bit number of the specific pattern read in the step (b); and (d) determining that the storage unit has defect when the error bit number is larger than a error bit threshold value, wherein the error bit threshold value is smaller than a correctable bit number for a error correction code corresponding to the specific pattern.

14 Claims, 2 Drawing Sheets

METHOD FOR TESTING STORAGE APPARATUS AND SYSTEM THEREOF

BACKGROUND OF THE INVENTION

1. Field of the Invention

The present invention relates to a method for testing a storage apparatus and a system thereof, and particularly relates to a method for testing a storage apparatus that first roughly test if the storage apparatus has defect or not, and then test if the storage apparatus has defect or not for some specific characteristic, and a system thereof.

2. Description of the Prior Art

For a prior art method for testing a storage apparatus such as a memory, large amount of patterns are written to a storage device to be tested, and then the patterns are read out and compared with a standard writing result to determine whether the storage apparatus has defect or not. However, such method must repeat the operations of reading and writing since large amount of patterns need to be written to the storage device to be tested. Such operations not only consume a lot of time, but also cause disadvantage for the endurance of the memory, since the accessing times of the memory are limited

SUMMARY OF THE INVENTION

Therefore, one objective of the present invention is to provide a method for testing a storage apparatus and a system thereof, which does not need to utilize a large amount of patterns to detect the storage apparatus. Also, another objective of the present invention is to provide a mechanism to adjust a threshold value of error bits, and makes the testing of the memory more efficiently.

One embodiment of the present invention discloses a method for testing a storage apparatus, which includes: (a) writing a specific pattern to a storage unit of a storage apparatus; (b) reading the specific pattern written to the storage apparatus; (c) determining an error bit number of the specific pattern read in the step (b); and (d) determining that the storage unit has defect when the error bit number is larger than a error bit threshold value, wherein the error bit threshold value is smaller than a correctable bit number for a error correction code corresponding to the specific pattern.

Another embodiment of the present invention discloses a system for testing a storage apparatus, which includes: a processing apparatus, for writing a specific pattern to a storage unit of a storage apparatus; and a determining apparatus, for reading the specific pattern written to the storage apparatus. For determining an error bit number of the read specific pattern, and for determining that the storage unit has a defect when the error bit number is larger than a error bit threshold value; wherein the error bit threshold value is smaller than a correctable bit number for a error correction code corresponding to the specific pattern.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
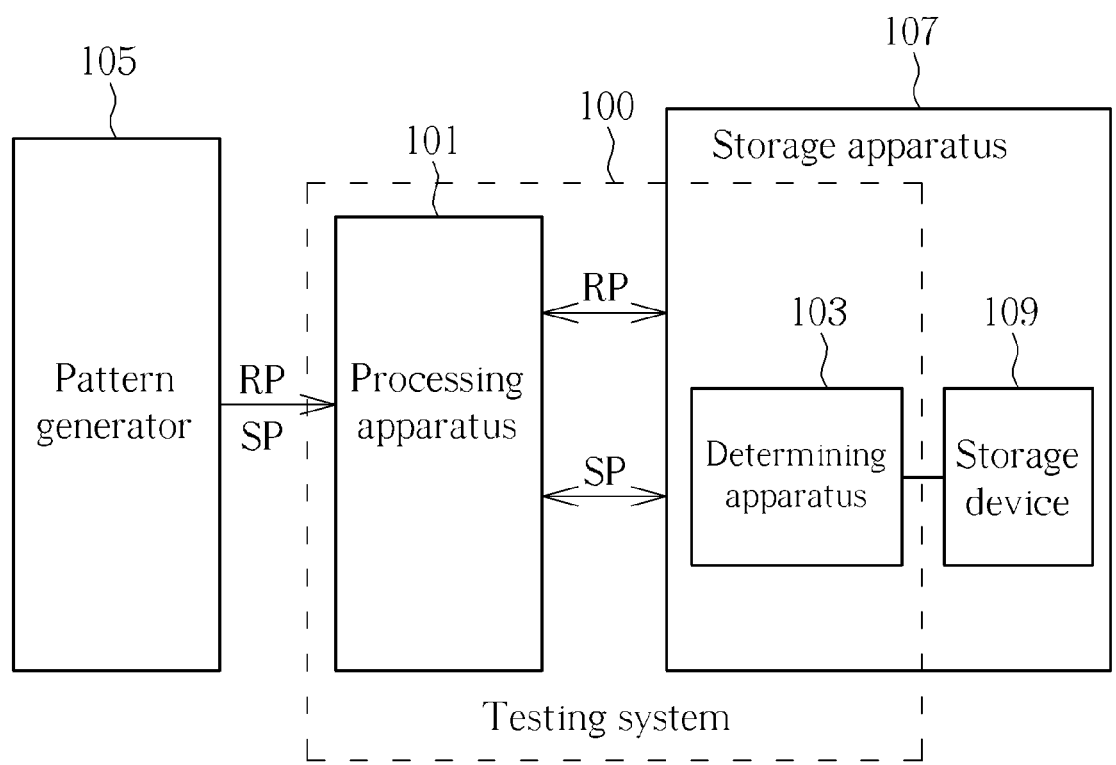
FIG. 1 illustrates a testing system for testing a storage device according to one embodiment of the present invention.

FIG. 1 illustrates a testing system 100 for testing a storage device according to one embodiment of the present invention. As shown in FIG. 1, the testing system 100 includes a processing apparatus 101 and a determining apparatus 103. The processing apparatus 101 writes a random pattern RP to a storage unit (not illustrated) of the storage device 109. The determining apparatus 103 reads the random pattern RP written to the storage unit to generate a first writing result, and compares the first writing result and a first standard writing result, which can be the random pattern RP itself, to obtain a first detecting result. If the first testing result indicates that the storage unit has a defect, the processing apparatus 101 writes a specific patter SP such as 55AA or 00FF, which tends to cause the accessing error of the storage apparatus to the storage unit, wherein the selection of the specific pattern SP corresponds to a storage apparatus characteristic. Also, the determining apparatus 103 further reads the specific pattern SP written to the storage unit to obtain a second testing result, which can be the same as the specific pattern SP, and determines if the storage unit has a defect according to the second detecting result. In this embodiment, the random pattern RP and the specific patter SP are generated by a pattern generator 105, but also can be generated by other methods or apparatuses.

Briefly, one concept of the present invention is utilizing a random generated pattern RP to roughly detect if a storage unit of the storage device has a defect or not, and utilizing specific pattern SP to detect if any defect for a specific storage device characteristic exist. Text books and related documents record the relations between specific pattern SP and the kind of storage device characteristic does the defect correspond to. It should be noted that not only random generated patterns RP, but also a plurality of specific patterns can be utilized to perform the rough detection of the first time, and then utilize the specific patterns for the detection of the second time. Such variation should also fall in the scope of the present application.

In one embodiment, the storage apparatus 107 can be a SD card, and the storage device 109 can be a flash memory. The storage apparatus 107 further includes a controller (not illustrated) to control the accessing of the storage device 109. The controller has the function of error correction, and the determining apparatus 103 can be merged to the controller. The writing amount of the pattern varies corresponding to different memory types. For example, if the storage device 109 is a NAND flash, the pattern can be written one page/per time. For example, in this embodiment, the processing apparatus 101 writes the specific pattern 00FF to each sector in a page B of the block A in the storage device 109, and generates a corresponding ECC (Error Correction Code) according to the specific pattern 00FF. Besides, the specific pattern 00FF and corresponding ECC are stored to each sector for a page B of the block A in the storage device 109.

After that, the determining apparatus 103 reads the data stored in the sector C of a page B to generate a writing result such as a pattern 00FE. The determining apparatus 103 compares the writing result and the standard writing result, which can be the specific pattern itself, to obtain the testing result. In another embodiment, the determining apparatus 103 also reads the ECC stored in the sector C and the writing result to obtain the testing result. In this embodiment, the testing result obtained by the determining apparatus 103 is 1 bit error. The determining apparatus 103 can determine if the sector has a defect according to the bit error number, for example, if the error bit number is more than 4, the sector is determined to be broken.

Please note, the storage apparatus 107 always includes some error correction ability. For example, the controller utilizes some ECC code to find N error bits while reading data of a sector. Also, if N is smaller or equals to a specific value (for example: M bits), the controller can utilizes the ECC to correct the N error bits. In this case, M bits indicates the correction ability that the controller can utilize the ECC to correct sector data. Alternatively, M bits can be regarded the correctable bit number that the ECC can control. In this embodiment, the determining apparatus 103 will set an error bit threshold value $E_{TH}$, and the determining apparatus 103 will determine the storage unit corresponding to the testing result breaks when the testing result indicates that the error bit number is larger or equals to the error bit threshold value $E_{TH}$. The error bit threshold value $E_{TH}$ is smaller than the error correction ability of the controller. For example, the controller has 8 bit error correction ability while utilizing the ECC, and the determining apparatus 103 sets the error bit threshold value to be 4 bits. The determining apparatus 103 determines the sector to be broken when testing result of a sector displays that the error bit number is five bits.

By this way, the tester can largely decrease the amount of pattern, and utilizes the pattern that may easily causes accessing error to perform testing. Also, strict determining rules are applied to the operation of determining if the storage unit has a defect according to the error bit number, to decrease testing time and correctly finds out the real broken storage unit.

Besides, the value of the error bit threshold value $E_{TH}$ can be determined according to the characteristic of the storage device 109. For example, the value of the error bit threshold value $E_{TH}$ can be decreased to a smaller value such as 2 bits, to finds out all broken sectors when the storage device 109 is a down grade memory with lower quality. Also, the value of the error bit threshold value $E_{TH}$ can be increased to a larger value such as 6 bits when the storage device 109 is a memory with high quality.

That is, the second testing result can include statistics of error detection code, and the determining apparatus 103 determines the storage unit having a defect when the error detection code is larger than a predetermined value (the error bit threshold value $E_{TH}$). For example, the determining apparatus 103 determines that the storage unit has a defect when the number of error bit, found by utilizing the error detection code, is larger than 4 bits. The error detection code discussed here indicates the codes stored in the storage unit to determine if any error exists for memory accessing. One type of the frequently used error detection code is error correction code, which is stored in the sector of a block.

Therefore, another embodiment of the present invention discloses utilizing fewer amount of pattern to test the memory, and flexibly adjust error bit number to determine if the storage unit has a defect, to decrease testing time and increase testing convenience.

In above-mentioned embodiment, when the storage unit 109 includes a plurality of storage units, the determining module can select a well-operated storage unit from a plurality of storage units, and utilizes the well-operated storage unit as a standard memory to write the first or second pattern to the well-operated storage unit for respectively generating the first or the second standard writing result. One of the methods is that the determining apparatus 103 starts testing from the first storage unit of the storage device 109 until a well-operated storage unit is found to select a well-operated storage unit. After that, utilizing the well-operated storage unit as a base to keep testing other storage units. The processing apparatus 101 can be a computer apparatus or a tester for testing the memory. Also, the determining apparatus 103 can be implemented by software or hardware, and can be merged to the processing apparatus 101 or merged to a controller (not illustrated) for controlling the controlling device 109. The determining apparatus 103 and the storage device 109 can be jointly provided in a storage apparatus 107 when the determining apparatus 103 is merged to a controller for controlling the controlling device 109.

Figure 2:
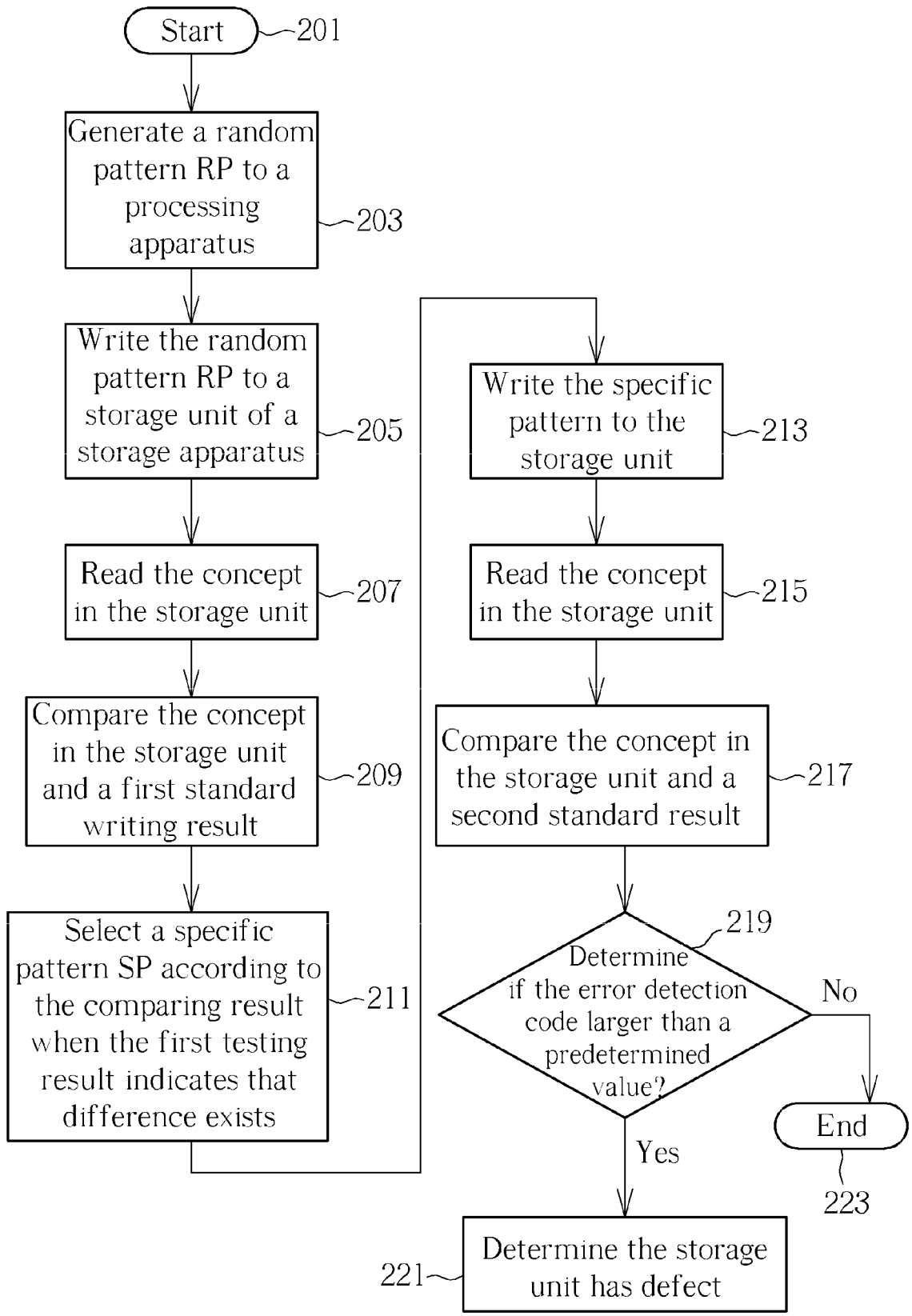
FIG. 2 illustrates a method for testing a storage device according to one embodiment of the present invention.

FIG. 2 illustrates a method for testing a storage device according to one embodiment of the present invention, and please jointly refer to FIG. 1 and FIG. 2 to understand the concept of the present invention more clearly. The method for testing a storage device shown in FIG. 2 includes:

Step 201
Start.
Step 203
Generate a random pattern RP to a processing apparatus.
Step 205
Utilize the processing apparatus to write the random pattern RP to a storage unit of a storage apparatus.
Step 207
Read the content in the storage unit.
Step 209
Compare the content in the storage unit and a first standard writing result to obtain a first testing result. The generation of the first standard writing result can be as above-mentioned description, selecting a well-operated storage unit, writing the random pattern RP to a well-operated storage unit and reading out the random pattern RP as the first standard writing result. Alternatively, the random pattern RP can be directly utilized as the first standard writing result.
Step 211
Select a specific pattern SP according to the first testing result when the first testing result indicates that difference exists.
Step 213
Write the specific pattern to the storage unit.
Step 215
Read the content in the storage unit.
Step 217
Compare the content in the storage unit and a second standard result to obtain a second testing result. The generation of the second standard writing result can be as above-mentioned description, selecting a well-operated storage unit, writing the specific pattern SP to a well-operated storage unit and reading out the specific pattern SP as the second standard writing result. In this embodiment, the second testing result includes the static of the error amount indicated by the error detection code, thus the step 219 will determine if the error indicated by the error detection code (or, in other words, error found by utilizing the error detection code) is larger than a predetermined value or not.

Step 219

Determine if the error (for example, the above mentioned N error bits) indicated by the error correction code is larger than a predetermined value (for example, the above mentioned bit threshold value $E_{TH}$). If yes, go to step 221, if not, ends. As above-mentioned the error correction code can be ECC code, thus the predetermined value can be set to a specific error bit number (for example, 4 bits). In one embodiment, the predetermined value can be set according to the quality of the storage device. For example, when the quality of the storage device is lower, the predetermined value is set to be lower to exactly find out poor storage units in the storage device. On the other hand, if the storage device has higher quality, it is believed that most part of which is available storage unit, and the predetermined value is increased. In another embodiment, the predetermined value can be set according to the error correction ability of the controller, which can control the storage apparatus. If the controller has better error correction ability, the predetermined value can be increased. If the controller has worse error correction ability, the predetermined value can increased be decreased.

Step 221

Determine the storage unit has a defect. Besides, the storage unit which is determined to have a defect can be further marked that the storage unit has a defect, i.e. mark bad. By this way, the storage unit with defect will not be accessed when the following accessing operation is performed.

Step 223

End.

It should be noted that two major points of the present invention are disclosed according to above-mentioned embodiments. One is utilizing two stages of the patterns (random and specific) to decrease testing numbers. The other one is utilizing the specific pattern and flexibly adjusting error threshold value to decrease patterns and makes the testing adjustable. Accordingly, the step 203 to 211 can be omitted, which also falls in the scope of the present invention.

According to above-mentioned embodiments, the present invention can utilize the random pattern to roughly find out the storage unit with defect, and then utilize the specific pattern to find out if the storage unit has some errors corresponding to particular characteristics. By this way, the large amount of the pattern as stated in the prior art can be avoided.

Those skilled in the art will readily observe that numerous modifications and alterations of the device and method may be made while retaining the teachings of the invention.

What is claimed is:

1. A method for testing a storage apparatus, comprising:
   writing a first pattern to a storage unit of the storage apparatus;
   reading the first pattern written to the storage unit to generate a first writing result; and
   comparing the first writing result and a first standard writing result to obtain a first testing result, when the first testing result indicates that the storage unit has a defect, performing the followings steps:
   writing a specific pattern to the storage unit of the storage apparatus;
   reading the specific pattern written to the storage unit;
   determining an error bit number of the specific pattern read in the step of reading the specific pattern written to the storage unit; and
   determining that the storage unit has a defect when the error bit number is larger than an error bit threshold value, wherein the error bit threshold value is smaller than a correctable bit number for an error correction code corresponding to the specific pattern.

2. The method for testing a storage apparatus of claim 1, wherein the error bit threshold value is determined according to quality of the storage apparatus.

3. The method for testing a storage apparatus of claim 2, wherein the storage unit is a block, a page, or a sector.

4. The method for testing a storage apparatus of claim 1, wherein the first pattern is randomly generated.

5. The method for testing a storage apparatus of claim 1, wherein the storage apparatus includes a plurality of storage units, wherein the method for testing a storage apparatus further comprises:
   selecting a well-operated storage unit from the storage units; and
   writing the first or a second pattern to the well-operated storage unit to generate the first or the second standard writing result.

6. A system for testing a storage apparatus, comprising:
   a processing apparatus, for writing a specific pattern to a storage unit of a storage apparatus; and
   a determining apparatus, for reading the specific pattern written to the storage apparatus, for determining an error bit number of the read specific pattern, and for determining that the storage unit has defect when the error bit number is larger than a error bit threshold value; wherein the error bit threshold value is smaller than a correctable bit number for a error correction code corresponding to the specific pattern, wherein the processing apparatus writes a first pattern to the storage unit before writes the specific pattern to the storage unit, wherein the determining apparatus reads the first pattern written to the storage unit to generate a first writing result, and compares the first writing result and a first standard writing result to obtain a first testing result; wherein the processing apparatus writes the specific pattern to the storage unit when the first testing result indicates that the storage unit has a defect.

7. The system for testing a storage apparatus of claim 6, wherein the storage apparatus is a flash memory.

8. The system for testing a storage apparatus of claim 7, wherein the storage unit is a block, a page, or a sector.

9. The system for testing a storage apparatus of claim 6, wherein the first pattern is randomly generated.

10. The system for testing a storage apparatus of claim 6, wherein the storage apparatus includes a plurality of storage units, where the determining apparatus selects a well-operated storage unit from the storage units, and writes the first or a second pattern to the well-operated storage unit to generate the first or the second standard writing result.

11. The system for testing a storage apparatus of claim 6, wherein the processing apparatus is a computer apparatus.

12. The system for testing a storage apparatus of claim 6, wherein the determining apparatus is merged to the processing apparatus.

13. The system for testing a storage apparatus of claim 6, wherein the determining apparatus is merged to a controller for controlling the storage apparatus.

14. The system for testing a storage apparatus of claim 6, wherein the error bit threshold value is determined according to quality of the storage apparatus.

* * * * *